United States Patent
Furuta et al.

Patent Number: 6,087,688
Date of Patent: Jul. 11, 2000

[54] FIELD EFFECT TRANSISTOR

[75] Inventors: Taku Furuta; Yoshihiko Nagayasu, both of Nagano, Japan

[73] Assignee: Fuji Electric Co., Ltd., Japan

[21] Appl. No.: 09/261,809

[22] Filed: Mar. 3, 1999

[30] Foreign Application Priority Data

Mar. 3, 1998 [JP] Japan ................... 10-050984

[51] Int. Cl.$^7$ .......... H01L 29/76; H01L 29/94; H01L 31/062; H01L 31/113; H01L 31/119
[52] U.S. Cl. .......... 257/295; 257/411; 257/412
[58] Field of Search ................. 257/295, 410, 257/411, 412

[56] References Cited

U.S. PATENT DOCUMENTS

| | | | |
|---|---|---|---|
| 3,832,700 | 8/1974 | Wu et al. | |
| 5,368,094 | 11/1994 | Takasu | 257/295 |
| 5,572,052 | 11/1996 | Kashihara et al. | 257/295 |
| 5,621,681 | 4/1997 | Moon | 365/145 |
| 5,812,422 | 9/1998 | Yoo | 365/145 |
| 5,821,005 | 10/1998 | Kijima et al. | 428/701 |
| 5,959,879 | 9/1999 | Koo | 265/145 |
| 5,962,884 | 10/1999 | Hsu et al. | 257/295 |

FOREIGN PATENT DOCUMENTS

| | | |
|---|---|---|
| 5-243562 | 9/1993 | Japan . |
| 9-213819 | 8/1997 | Japan . |
| 11-050255 | 2/1999 | Japan . |

*Primary Examiner*—Ngân V. Ngô
*Attorney, Agent, or Firm*—Morrison Law Firm

[57] ABSTRACT

A field effect transistor utilizes an oxide film to obtain satisfactory performance characteristics and ease of manufacture. The field effect transistor includes a gate over a silicon substrate. The gate of the field effect transistor consists of an oxide film on the silicon substrate, a ferroelectric film on the oxide film, and an electrode metal film on the ferroelectric film. The material and the thickness of ferroelectric film are selected such that the product of the relative dielectric constant of ferroelectric film and the electric field across ferroelectric film is less than 15.6 Mv/cm. The ferroelectric film is easily formed on the oxide film. An electric filed across the oxide film of more than 4 MV/cm will result in a break down in the oxide layer. By employing a ferroelectric film with a low relative dielectric constant, the applied electric field across the oxide film is less than 4 Mv/cm. In another embodiment of the invention, a gate includes an oxide layer, an intermediate layer on the oxide layer and a ferroelectric layer on the oxide layer. The intermediate layer provides an improvement to the crystallinity of the ferroelectric layer which results in enhanced performance to the transistor, for example the turn-on voltage. The intermediate layer consists of a titanium layer on a platinum layer. The platinum layer is formed on the oxide layer to prevent the intermediate layer from peeling away from the oxide layer. The titanium layer improves the crystallinity of the ferroelectric layer.

16 Claims, 4 Drawing Sheets

FIELD EFFECT TRANSISTOR

BACKGROUND OF THE INVENTION

The present invention relates to a field effect transistor. More specifically, the present invention relates to a field effect transistor that includes a gate having a ternary laminate structure composed of an electrode metal film, a ferroelectric film and an oxide film.

The so-called metal ferroelectrics semiconductor (MFS) type field effect transistor (FET) has a gate which includes a ferroelectric film. This type of field effect transistor utilizes dielectric polarization of the ferroelectrics for its turning-on and -off. An MFS-FET includes a gate, a drain on one side of the gate and a source on another side of the gate electrode. The gate includes a thin ferroelectric film formed directly on a silicon substrate. An electrode metal film is then formed on the ferroelectric film. The drain includes a drain diffusion region in a surface portion of the silicon substrate on one side of the gate. An electrode metal film is formed on the drain diffusion region. The source includes a source diffusion region in another surface portion of the silicon substrate on another side of the gate. An electrode metal film is formed on the source diffusion region.

There are difficulties in forming a ferroelectric film directly onto a silicon substrate. These difficulties are due to differences in the lattice constants of ferroelectrics and silicon. Moreover, an oxide film may form between the ferroelectric film and the silicon substrate. The ferroelectic film is heat treaded to crystallize the deposited material on the substrate. This heat treatment causes a mutual diffusion in the constituent elements of the ferroelectric film and the substrate. This mutual diffusion impairs the crystallinity of the ferroelectric film and the silicon substrate. The mutual diffusion causes poor performance characteristics in the resulting field effect transistor. It is important to note that unwanted energy levels are formed between the ferroelectric film and the silicon substrate. The unwanted energy levels result in a malfunctioning field effect transistor.

Most of the voltage that is applied between the gate electrode and the silicon substrate is applied to the oxide film. The applied voltage causes the oxide film to break down while the field effect transistor is in use. The break down in the oxide film is a main cause of failure in this type of field effect transistor. As a consequence of this, the oxide film on the surface of a silicon substrate is normally removed before the ferroelectric film is formed on the silicon substrate. Oxide film formation is suppressed as much as possible during the formation of the ferroelectric film.

A Conventional MFS-type FET is hard to manufacture and its behavior is unstable. During deposition of a ferroelectric film in the substrate, it is impossible to prevent the formation of an oxide film on the surface of the silicon substrate. The resulting oxide film breaks down while the field effect transistor is used, resulting in failure of the field effect transistor.

OBJECTS AND SUMMARY OF THE INVENTION

It is an object of the present invention to provide a field effect transistor which overcomes the drawbacks of the prior art.

It is another object of the invention to provide a field effect transistor that obviates the problems caused by the oxide film and exhibits desirable characteristics.

It is yet another object of the invention to provide a field effect transistor that is easy to manufacture.

According to an aspect of the invention, there is provided for a field effect transistor that includes: a gate including an oxide film, a ferroelectric film on the oxide film and an electrode metal film on the ferroelectric film; the ferroelectric film being formed such that the product of its relative dielectric constant and the electric field across it is less than 15.6 MV/cm. The relative dielectric constant of the ferroelectric film is set to a small value so that application of an electric field which would be high enough to cause breakdown is not applied accross the oxide film. The relative dielectric constant of the ferroelectric film is set to a small value by using a ferroelectric with a low dielectric permeability or by setting the thickness of the ferroelectric film to be thin. The intentionally formed oxide film is utilized as a part of the gate structure to facilitate forming the ferroelectric film thereon.

Briefly stated, the present invention provides for a field effect transistor that utilizes an oxide film to obtain satisfactory performance characteristics and ease of manufacture. The field effect transistor includes a gate over a silicon substrate. The gate of the field effect transistor consists of an oxide film on the silicon substrate, a ferroelectric film on the oxide film, and an electrode metal film on the ferroelectric film. The material and the thickness of ferroelectric film are selected such that the product of the relative dielectric constant of ferroelectric film and the electric field across ferroelectric film is less than 15.6 MV/cm. The ferroelectric film is easily formed on the oxide film. An electric filed across the oxide film of more than 4 MV/cm will result in a break down in the oxide layer. By employing a ferroelectric film with a low relative dielectric constant, the applied electric field across the oxide film is less than 4 MV/cm. In another embodiment of the invention, a gate includes an oxide layer, an intermediate layer on the oxide layer and a ferroelectric layer on the oxide layer. The intermediate layer provides an improvement to the crystallinity of the ferroelectric layer which results in enhanced performance to the transistor, for example the turn-on voltage. The intermediate layer consists of a titanium layer on a platinum layer. The platinum layer is formed on the oxide layer to prevent the intermediate layer from peeling away from the oxide layer. The titanium layer improves the crystallinity of the ferroelectric layer.

According to an embodiment of the present invention, there is provided for a field effect transistor comprising: a gate including an oxide film, a ferroelectric film on the oxide film and an electrode metal film on the ferroelectric film, the ferroelectric film being of a material producing a predetermined relative dielectric constant, and a product of the relative dielectric constant and an electric field across the ferroelectric film is less than 15.6 MV/cm.

According to another embodiment of the present invention, there is provided for a field effect transistor, comprising: a gate including an oxide film and a ferroelectric film on the oxide film, the ferroelectric film being of a material producing a predetermined relative dielectric constant, and the relative dielectric constant such that an operation of the gate will not produce an electric field across the oxide film of more than 4 MV/cm whereby operation of the transistor is achieved without producing a breakdown in the oxide film.

According to yet another embodiment of the present invention, there is provided for a field effect transistor, comprising: a gate including an oxide layer, an intermediate layer on the oxide layer, and a ferroelectric layer on the oxide layer, the ferroelectric layer having a crystallinity, and the intermediate layer includes means for improving the crystallinity of the ferroelectric layer.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
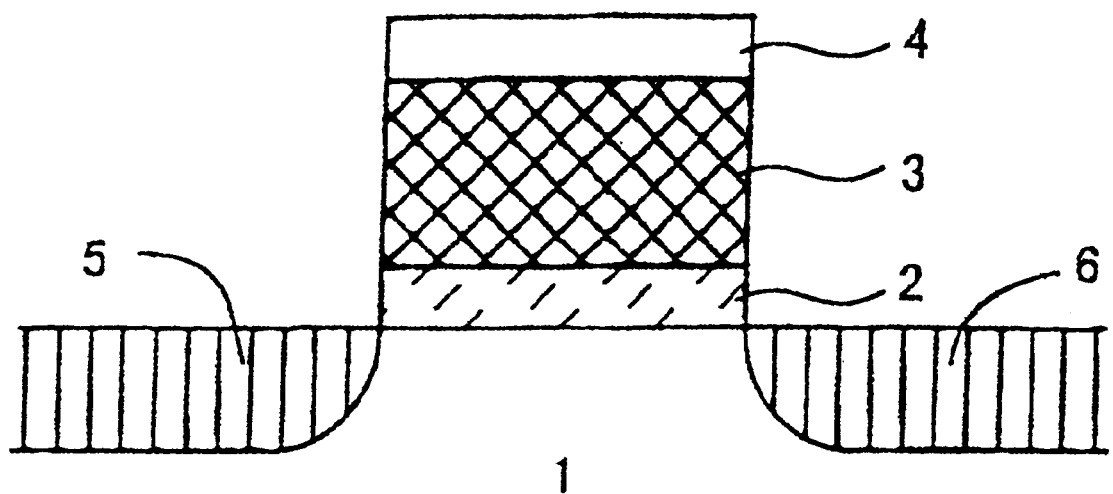
FIG. 1 is a cross section of a field effect transistor according to an embodiment of the invention.

Now the present invention will be explained hereinafter with reference made to the accompanying figures which illustrate the preferred embodiments of the invention. Throughout the figures, like parts are designated by the same reference numerals and their duplicated explanations are omitted for the sake of simplicity.

FIG. 1 shows a cross section of a field effect transistor which is designed in accordance with an embodiment of the invention. As shown in FIG. 1, a gate includes an oxide film 2 on a silicon substrate 1, a ferroelectric film 3 on oxide film 2 and an electrode metal film 4 on ferroelectric film 3. A source 5 and a drain 6 are space apart from each other on silicon substrate 1 by the gate. The metal electrode films of source 5 and drain 6 are not illustrated.

The field effect transistor of FIG. 1 positively utilizes the oxide film 2 as part of the structure of the device. The oxide film 2 is located between the substrate 1 and the ferroelectric film 3. As discussed previously, the prior art considers it hazardous to apply a voltage to a ferroelectric film when the oxide layer is present between the ferrolectric film and the substrate.

It is preferred that the relative dielectric constant of the ferroelectrics is less than 156 for following reason.

Figure 2:
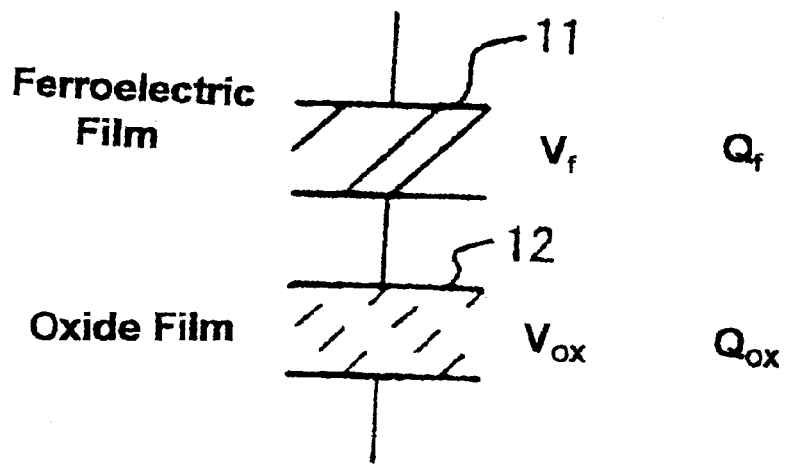
FIG. 2 is an electrical equivalent circuit of the portion that constitutes a field effect transistor.

When it is desired to operate a field effect transistor, a voltage is applied to the gate of a device. To accomplish this, a voltage is applied between the gate electrode (metal film 4) and the substrate 1. FIG. 2 shows an equivalent electrical circuit for the gate portion of a field effect transistor in operation. The ferroelectric film 3 and the oxide film 3 taken together constitute the gate portion of the device.

As shown in FIG. 2, ferroelectric film 3 and oxide film 2 are electrically represented by two capacitors 11 and 12 connected in series to each other. When the device is operated by applying a voltage between the gate and substrate, (electrode metal film 4 and silicon substrate 1), a voltage is applied across the series connected capacitors. The voltage $V_f$ is the voltage across capacitor 11 that represents ferroelectric film 3. The voltage $V_{ox}$ is the voltage across capacitor 12 that represents oxide film 2. $Q_f$ represents the charge stored in capacitor 11. $Q_{ox}$ represents the charge stored in capacitor 12.

The constants used in the following descriptions will be explained at first below.

| | |
|---|---|
| $V_f$: | Voltage applied to the ferroelectric film |
| $E_f$: | Electric field across the ferroelectric film |
| $C_f$: | Electrostatic capacity of the ferroelectric film |
| $t_f$: | Thickness of the ferroelectric film |
| $\epsilon_f$: | Dielectric permeability of the ferroelectric film |
| $V_{ox}$: | Voltage applied to the oxide film |
| $E_{ox}$: | Electric field across the oxide film |
| $C_{ox}$: | Electrostatic capacity of the oxide film |
| $t_{ox}$: | Thickness of the oxide film |
| $\epsilon_{ox}$: | Dielectric permeability of the oxide film |
| $\epsilon_o$: | Dielectric permeability of vacuum |

When the ferroelectric is polarized, the charges $Q_f$ and $Q_{ox}$ induced in capacitors 11 and 12 are same. The charges $Q_f$ and $Q_{ox}$ are expressed by the products of the respective electrostatic capacities and the voltages as expressed by the following equation (1).

$$C_f \cdot V_f = C_{ox} \cdot V_{ox} \quad (1)$$

Considering the unit area of the films, the electrostatic capacities $C_f$ and $C_{ox}$ of capacitors 11 and 12 are expressed by the following equations (2a) and (2b).

$$C_f = \epsilon_f / t_f \quad (2a)$$

$$C_{ox} = \epsilon_{ox} / t_{ox} \quad (2b)$$

The voltages applied to capacitors 11 and 12 are expressed by the following equations (3a) and (3b).

$$V_f = E_f \cdot t_f \quad (3a)$$

$$V_{ox} = E_{ox} \cdot t_{ox} \quad (3b)$$

Therefore, the following relational expression (4) is obtained by substituting the equations (3a) and (3b) in to the equation (1).

$$\epsilon_f / \epsilon_{ox} = E_{ox} / E_f \quad (4)$$

The electric field $E_{ox}$ across oxide film 2 must be set to a value at which the oxide film 2 will never break down while the field effect transistor is used practically. This condition is expressed by the index described by K. Yamabe and K Taniguchi in "Time-dependent Dielectric Breakdown of Thin Thermally Grown $S_iO_2$ Films", IEEE JOURNAL OF SOLID-STATE CIRCUITS, vol. 20, No. 1 (1985).

Figure 3:
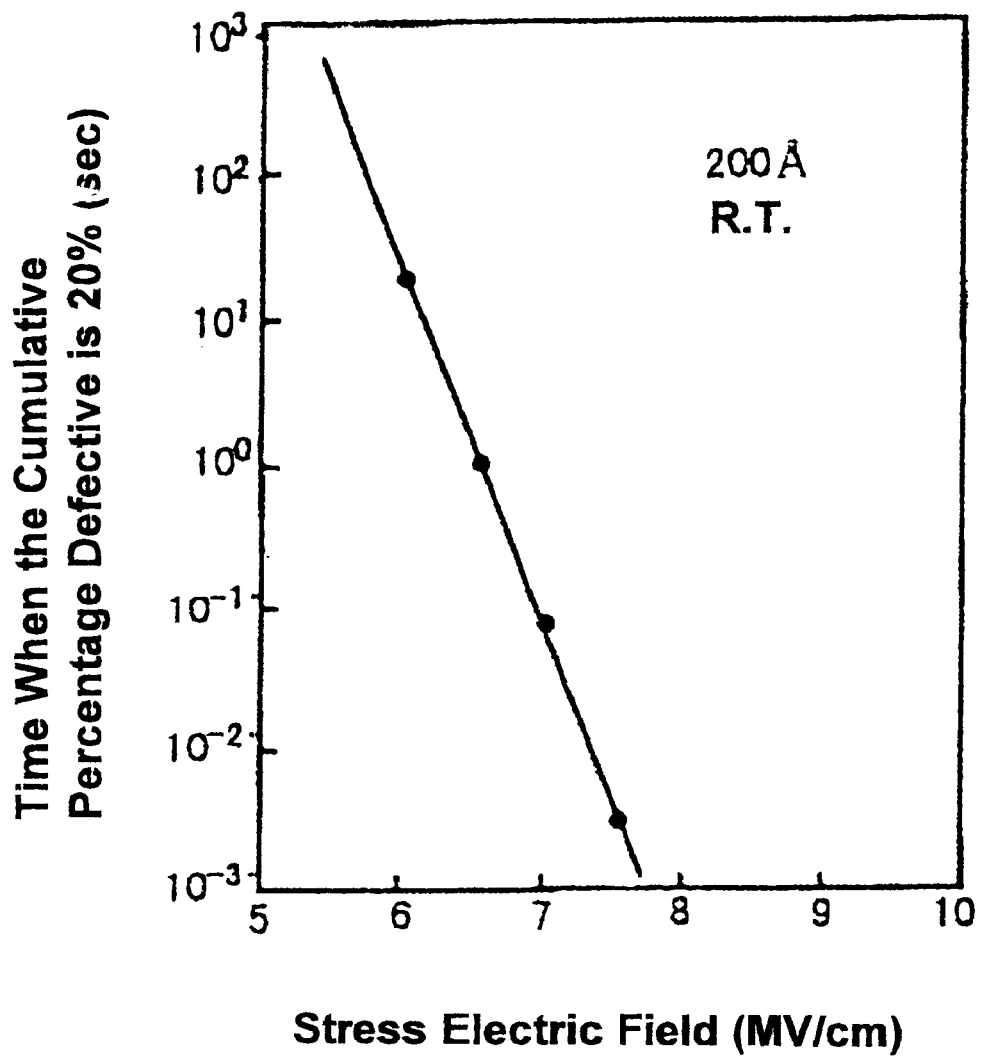
FIG. 3 is a graph relating the time, at that the cumulative percentage defective is 20%, with the stress electric field.

FIG. 3 shows a graph relating the time it takes for the cumulative percentage of defect to reach 20% when under the stress of an electric field. As shown in the figure, the amount of time it takes to reach 20% defects is proportional to the amount of stress the electric field is exerting. Also shown in FIG. 3, break down of the oxide film is achieved in a shorter time interval when the stress electric field is larger. Conversely, the oxide film endures for a longer time interval when the stress electric field is smaller.

Considering the above relations between the electric field and the cumulative percentage defective, it is preferred that the electric field $E_{ox}$ across oxide film 2 is less than 4 MV/cm. When this is followed, oxide film 2 will not break down when electric field $E_{ox}$ across oxide film 2 is less than 4 MV/cm.

By applying the relation of the dielectric permeability $\epsilon_{ox}$ of the oxide film, that is $\epsilon_{ox} = 3.9 \, \epsilon_o$, and the above condition $E_{ox}<4$ MV/cm to equation (4), the following relational expression (5) is obtained.

$$\epsilon_f E_f < 15.6 \, \epsilon_o \text{ MV/cm} \quad (5)$$

The relational expression (5) indicates that the field effect transistor will not be broken down as long as the product of the relative dielectric constant $\epsilon_f/\epsilon_o$ of ferroelectric film 3 and the electric field $E_f$ across ferroelectric film 3 is less than 15.6 MV/cm, even when oxide film 2 is between silicon substrate 1 and ferroelectric film 3.

As indicated by equation (5), the above requirements are met by selecting a ferroelectric material for ferroelectric film 3 where the dielectric permeability $\epsilon_f$ is suitably small, or by setting the electric field $E_f$ across ferroelectric film 3 to a suitably small value. As a matter of course, a certain electric field $E_f$ should be applied across ferroelectric film 3 to make the field effect transistor work. The strength of the electric field $E_f$ which is required to make the ferroelectrics transistor work will be discussed below.

Carlos Paz de Araujo, James F. Scott and George W. Taylor describe the relations between the electric field and the polarization charges for the case, in that lead zirconate titanate (Pb (Zr, Ti) O3) is used as a ferroelectrics, in "FERROELECTRIC THIN FILMS: SYNTHESIS AND BASIC PROPERTIES" (1996).

Figure 4:
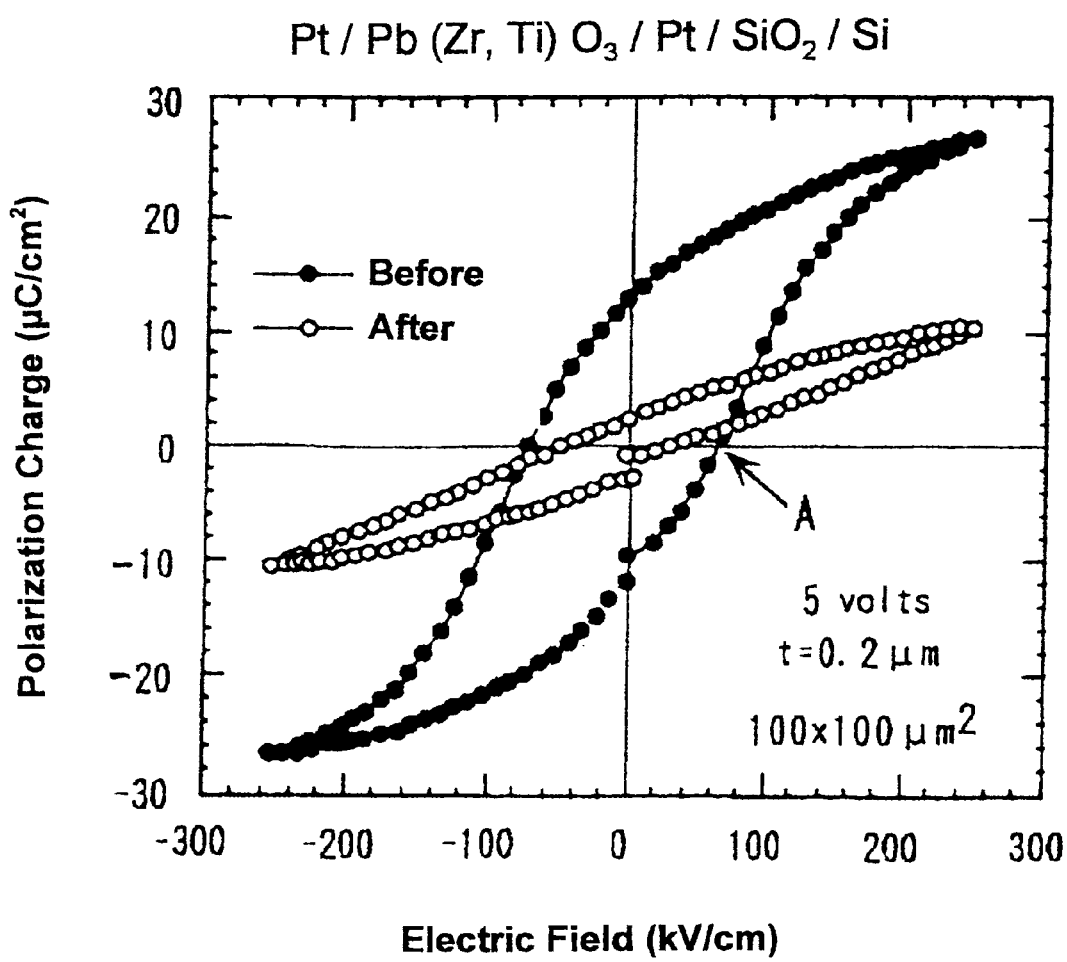
FIG. 4 is a pair of hysteresis loops relating the electric field and the polarization charges with each other.

FIG. 4 shows a pair of hysteresis loops relating the electric field and the polarization charges with each other before and after the fatigue test. As shown in FIG. 4, it is necessary for the electric field $E_f$ to be equal to or higher than the electric field $E_r$, i.e. the so-called coercive field A in FIG. 4, at that the moment polarization is caused. In addition, it is enough for the electric field $E_f$ to be 0.1 MV/cm. FIG. 4 indicates that the polarization charge at the electric field $E_f$ of 0.1 MV/cm is 10 $\mu$C/cm$^2$.

Various properties of MSF-FETs are described in "Integration Technology on Ferroelectric Thin Film Memories" (in Japanese), edited by Tadashi Shiozaki et. al., Science Forum, Inc., (1992), pp. 268–269. This publication describes that the polarization charge of 0.6 $\mu$C/cm$^2$ is enough to make the MFS-FET surely work as intended. Therefore, the polarization charge of 10 $\mu$C/cm$^2$ is sufficiently high for proper operation of the FET.

Thus, the following relational expression (6) is obtained from the relational expression (5) described above.

$$\epsilon_f < 156 \, \epsilon o \quad (6)$$

According to the above expression, as long as the electric field across ferroelectric film 3 is 0.1 MV/cm and its relative dielectric constant is less than 156, the field effect transistor operates normally and will not break down even if oxide film 2 is between silicon substrate 1 and ferroelectric film 3.

The ferroelectrics that exhibit the relative dielectric constant as described above will be explained below.

According to "Basis and Applications of Ferroelectric Thin Films for Nonvolatile Memories" (in Japanese), Text in the First Seminar School of JSAP Divisions Solid State Physics and Application, published from Japan Society of Applied Physics, (1997), the relative dielectric constant of Pb (Zr, Ti) O$_3$ is around 1000. However, the relative dielectric constant of Pb (Zr, Ti) O$_3$ lowers with increasing PbTiO$_3$ concentration (cf N. Setter "Ferroelectric Ceramics"). Therefore, by increasing the PbTiO$_3$ concentration in Pb (Zr, Ti) O$_3$, the field effect transistor having the structure as described in FIG. 1 is realized. The field effect transistor shown in FIG. 1 works as intended as long as an electric filed of greater than 4 MV / cm is not applied to the gate of the device.

It is disclosed in page 77 of the foregoing "Integration Technology on Ferroelectric Thin Film Memories" that the dielectric permeability tends to be smaller as the thickness of the Pb (Zr, Ti) O$_3$ film becomes thinner. The relative dielectric constant of the Pb (Zr, Ti) O$_3$ film is 600 for a film thickness of 110 nm and 250 for a film thickness of 40 nm. These values satisfy the condition expressed by the foregoing relational expression (6). Further, by setting the thickness of the Pb (Zr, Ti) O$_3$ film to 70 nm or less, the condition expressed by the relational expression (6) is satisfied with sufficient leeway. Thus, when the ferroelectric material is made from a film of Pb (Zr, Ti) O$_3$ with a thickness no greater than 70 nm, the electric field across the oxide film does not reach or exceed 4 MV/cm and a properly functioning field effect transistor is achieved.

Ferroelectric materials with a low relative dielectric constant are applicable to the ferroelectric film in the gate structure shown in FIG. 1. For example, the relative dielectric constant of BaBi$_4$Ti$_4$O$_{15}$ is 150 and the relative dielectric constant of K$_{0.5}$Bi$_{4.5}$Ti$_4$O$_{15}$ is 140 (cf. the foregoing JSAP Seminar School Text). Since the field effect transistor that employs one of these ferroelectrics surely works under the electric field $E_f$ of 0.1 MV/cm, the foregoing relational expression (5) is satisfied.

Figure 5:
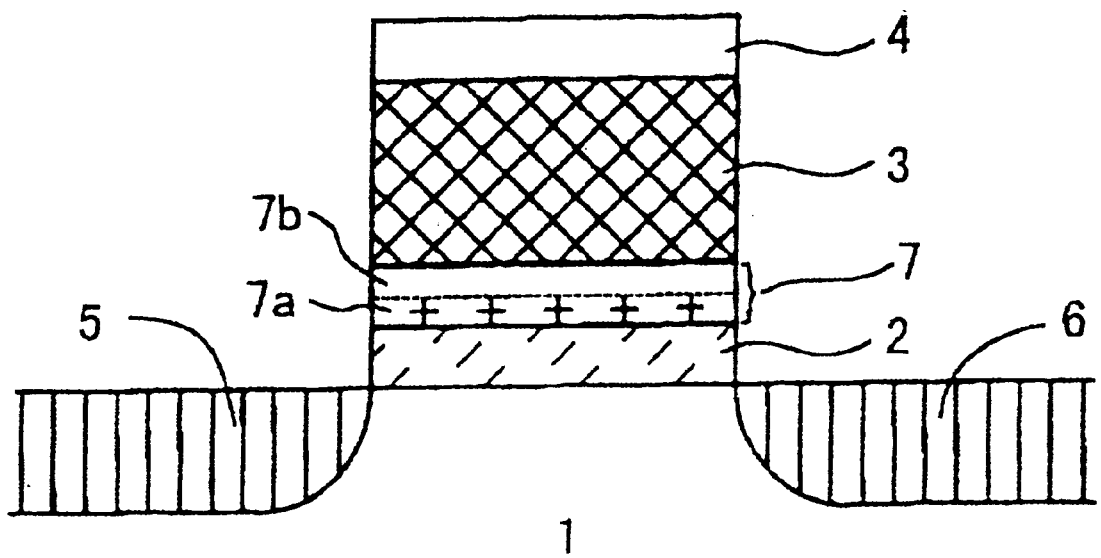
FIG. 5 is a cross section of a field effect transistor that includes a ferroelectric film, the crystallinity of that is improved, according to another embodiment of the invention.

FIG. 5 is a cross section of a field effect transistor, according to another embodiment of the invention, that includes a ferroelectric film with improved crystallinity. As shown in FIG. 5, an intermediate film 7 is formed between oxide film 2 and ferroelectric film 3. Intermediate film 7 consists of two layers: a titanium layer 7a on the side of oxide film 2, and a platinum layer 7b on the side of ferroelectric film 3. When intermediate film 7 is composed only of platinum, it tends to peel off from oxide film 2. Titanium layer 7a is interposed to prevent film 7 from peeling away from oxide film 2. The crystallinity of ferroelectric film 3 is improved by growing it on platinum layer 7b. The crystal structure of platinum exhibits a crystallinity which enhances the titanium crystallinity. The improved crystallinity of ferroelectric film 3 further improves the characteristics of the resulting transistor. For example, the amount of voltage required at the gate to turn on the transistor is lowered with improved crystallinity in the ferroelectric film 3.

Effects of the Invention

As explained above, the field effect transistor according to the invention includes an oxide film, interposed between a silicon substrate and a ferroelectric film. The transistor is constructed such that the product of the relative dielectric constant of the ferroelectric film and the electric field across the ferroelectric film is less than 15.6 Mv/cm. Since the ferroelectric film is formed easily on the oxide film, a field effect transistor is realized that is easy to manufacture and exhibits satisfactory characteristics. The oxide film prevents mutual diffusion of the constituent elements of the substrate and the ferroelectric film. Since the oxide film provides the field effect transistor with the same structure as the usual metal oxide semiconductor (MOS) structure, no unwanted energy levels are produced.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A field effect transistor comprising:

a gate including an oxide film, a ferroelectric film on said oxide film and an electrode metal film on said ferroelectric film;

said ferroelectric film being of a material producing a predetermined relative dielectric constant; and a product of said relative dielectric constant and an electric field across said ferroelectric film is less than 15.6 MV/cm.

2. A field effect transistor according to claim 1, wherein said relative dielectric constant of said ferroelectric film is equal to or less than 15.6 divided by the coercive field of said ferroelectric film.

3. A field effect transistor according to claim 2, wherein said relative dielectric constant of said ferroelectric film is less than 156 when said electric field across said ferroelectric film is 0.1 MV/cm.

4. A field effect transistor according to claim 2, wherein said ferroelectric film is a film of Pb (Zr, Ti) $O_3$; and said film of Pb (Zr, Ti) $O_3$ contains a high percentage of $PbTiO_3$ such that the relative dielectric constant of said Pb (Zr, Ti) $O_3$ is less than 156.

5. A field effect transistor according to claim 2, wherein said ferroelectric film comprises a Pb (Zr, Ti) $O_3$ film, said Pb (Zr, Ti) $O_3$ film having a thickness of no more than 70 nm.

6. A field effect transistor according to claim 2, wherein said ferroelectric film comprises a Pb (Zr, Ti) $O_3$ film, said Pb (Zr, Ti) $O_3$ film having a thickness of no more than 110 nm.

7. A field effect transistor according to claim 2, wherein said ferroelectric film comprises a Pb (Zr, Ti) $O_3$ film, said Pb (Zr, Ti) $O_3$ film having a thickness of no more than 40 nm.

8. A field effect transistor, comprising:

a gate including an oxide film and a ferroelectric film on said oxide film;

said ferroelectric film being of a material producing a predetermined relative dielectric constant; and said relative dielectric constant such that an operation of said gate will not produce an electric field across said oxide film of more than 4 MV/cm whereby operation of said transistor is achieved without producing a breakdown in said oxide film.

9. A field effect transistor, comprising:

a gate including an oxide layer, an intermediate layer on said oxide layer, and a ferroelectric layer on said intermediate layer;

said ferroelectric layer having a crystallinity;

said intermediate layer includes means for improving said crystallinity of said ferroelectric layer;

said ferroelectric layer being of a material producing a predetermined relative dielectric constant; and a product of said relative dielectric constant and an electric field across said ferroelectric layer is less than 15.6 MV/cm.

10. A field effect transistor as in claim, wherein said intermediate layer includes at least one titanium layer.

11. A field effect transistor as in claim 9, wherein said intermediate layer includes at least one platinum layer.

12. A field effect transistor as in claim 9, wherein said intermediate layer includes at least one titanium layer and at least one platinum layer.

13. A field effect transistor as in claim 9, further comprising:

said intermediate layer includes a layer of platinum on said oxide layer; and said intermediate layer also includes a titanium layer between said ferroelectric layer and said platinum layer, said titanium layer effective to prevent said intermediate layer from peeling away from said oxide layer.

14. A field effect transistor as in claim 9, further comprising:

said intermediate layer includes a layer of platinum on said oxide layer; and said intermediate layer also includes a titanium layer between said ferroelectric layer and said platinum layer, said platinum layer provides said means for improving the crystallinity of said ferroelectric layer.

15. A field effect transistor as in claim 9, further comprising:

said intermediate layer includes a layer of platinum on said oxide layer; and said intermediate layer also includes a titanium layer between said ferroelectric layer and said platinum layer, said intermediate layer effective to lower a turn on voltage applied to said gate of said transistor.

16. A field effect transistor, comprising:

a gate including an oxide layer, an intermediate layer on said oxide layer, and a ferroelectric layer on said intermediate layer;

said ferroelectric layer having a crystallinity;

said intermediate layer being effective to improve said crystalinity of said ferroelectric layer;

said intermediate layer having a platinum layer on said oxide layer; and said intermediate layer also having a titanium layer on said platinum layer such that said titanium layer is between said platinum layer and said ferroelectric layer.

* * * * *